United States Patent
Tamura

(10) Patent No.: US 6,270,686 B1
(45) Date of Patent: Aug. 7, 2001

(54) METHOD OF MAKING A WEAK-FIELD MAGNETIC FIELD SENSOR HAVING ETCHED CIRCUIT COILS

(75) Inventor: Yasuhiro Tamura, Yashio (JP)

(73) Assignee: AP One System Co., Ltd., Tokyo (JP)

( * ) Notice: Subject to any disclaimer, the term of this patent is extended or adjusted under 35 U.S.C. 154(b) by 0 days.

(21) Appl. No.: 09/288,613

(22) Filed: Apr. 9, 1999

Related U.S. Application Data

(62) Division of application No. 08/580,450, filed on Dec. 27, 1995, now Pat. No. 5,936,403.

(51) Int. Cl.⁷ .................................................. B44C 1/22
(52) U.S. Cl. ........................... 216/22; 324/200; 324/247; 324/248; 324/260; 336/232
(58) Field of Search .................................. 324/200, 248, 324/247, 260; 336/232; 216/22

(56) References Cited

U.S. PATENT DOCUMENTS

| | | |
|---|---|---|
| 4,385,273 | 5/1983 | Lienhard et al. . |
| 4,613,843 | 9/1986 | Esper et al. . |
| 4,733,180 * | 3/1988 | Hoenig et al. ........................ 324/248 |
| 5,012,190 | 4/1991 | Dössel . |
| 5,113,136 * | 5/1992 | Hayashi et al. ....................... 324/247 |
| 5,600,240 | 2/1997 | Mikhailovich et al. . |

* cited by examiner

*Primary Examiner*—Randy Gulakowski
*Assistant Examiner*—Michael Kornakov
(74) *Attorney, Agent, or Firm*—Blank Rome Comisky & McCauley LLP

(57) ABSTRACT

The subject of the invention is a weak-field magnetic sensor with the following features: etched circuit coils are substituted for conventional coil technology. The sensor includes an amorphous core having epoxy bases stacked relative to one another on the top and bottom surfaces thereof. One epoxy base has a coil Y etched thereon. A second epoxy base has a coil X etched thereon. The remaining epoxy base has circular patterns etched thereon. The amorphous core is formed from at least two amorphous thin boards stacked on opposite sides of an epoxy base thin board. The epoxy base thin board has a particular pattern etched thereon and the capacity for vertical conductivity. The coil conductor size and position accuracy is controlled in increments of microns by the etching process. The range of detection errors and the level of reception has no non-uniformities. A thin and small sensor in terms of the structure is therefore enabled. Moreover, the sensor is not easily affected by outside factors such as broken wires. It is also capable of being mass produced.

8 Claims, 2 Drawing Sheets

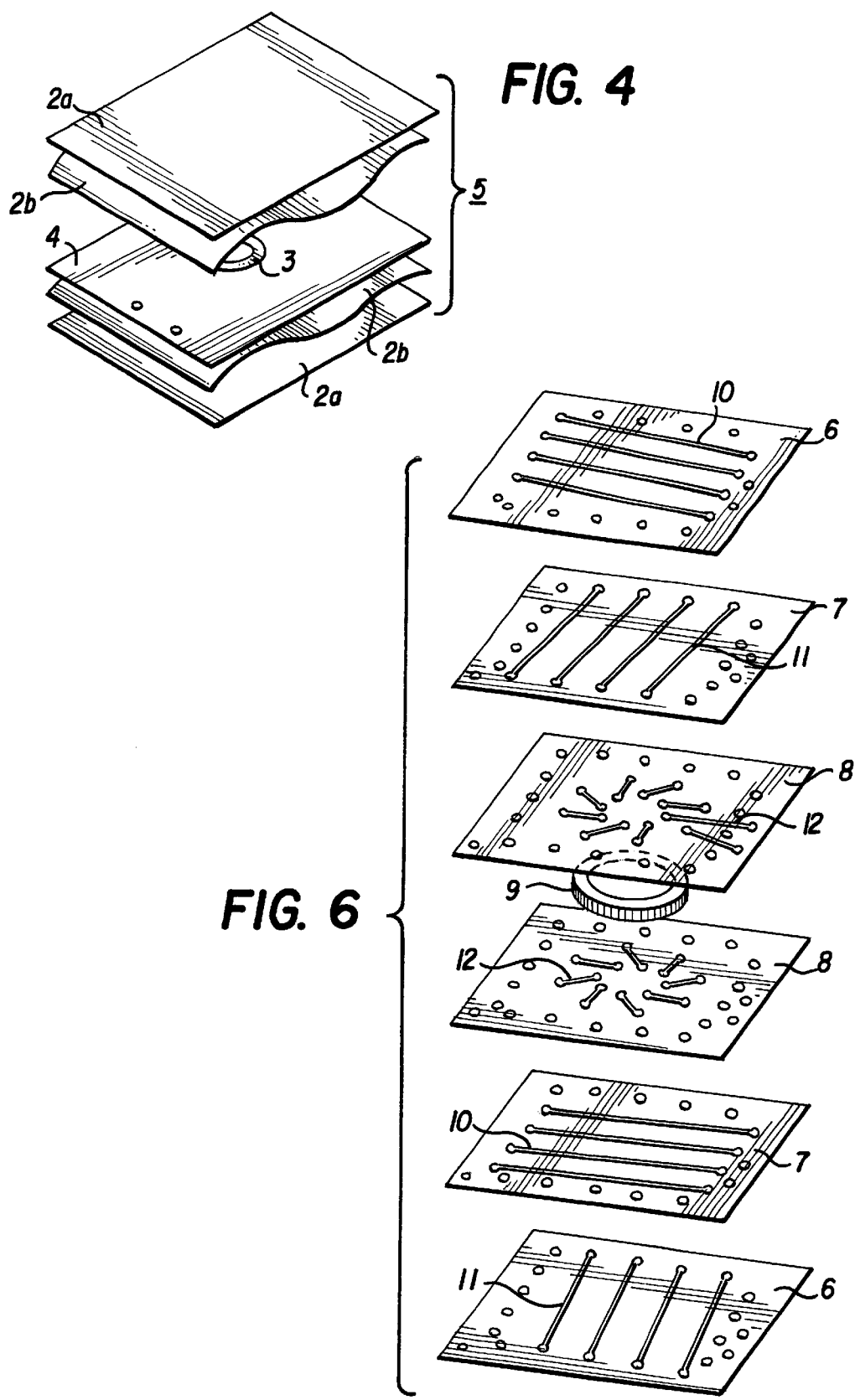

METHOD OF MAKING A WEAK-FIELD MAGNETIC FIELD SENSOR HAVING ETCHED CIRCUIT COILS

This is a divisional application of U.S. Ser. No. 08/580,540 U.S. Pat. No. 5,936,403, filed Dec. 27, 1995.

FIELD OF THE INVENTION

This invention relates to a weak-field magnetic sensor and includes methods for manufacturing the magnetic sensor. The weak-field magnetic sensor of the invention is useful for the detection of magnetism that is generated from the earth's natural magnetism and other substances.

BACKGROUND OF THE INVENTION

Generally, the basic components of known magnetic sensors are a magnetization coil and a detection coil. When metal substances are put near a sensor, the magnetic field changes due to the electric eddy current generated for the one side nearest the metal substances. The above mentioned change of magnetic field affects detection coil output. This process is utilized to detect magnetism. The magnetic sensor, because of its structure, is not easily affected by heat, light, or the surface of matters for detection. Moreover, it is possible to make small and light magnetic sensors.

The weak magnetic sensor of the prior existing technology has included the following characteristics: the magnetic sensor has adopted highly permeable magnetic materials for its core component. The sensor is composed of a primary coil and a secondary coil. The primary coil senses magnetism while the secondary coil detects the degree of saturation. The secondary coil has a magnetic axis in two directions so it can obtain the vector difference axis. Thus, the magnetic direction of weak-field magnetism can be measured.

In the prior technology, the magnetic materials were processed with precision. Then, the primary and the secondary coil were made utilizing a known wire coil technology. The wire coil technology was applied according to the positioning accuracy of the copper wires covered with the insulator. However, some magnetic materials with high permeability required a specific precision process. Moreover, the need for a separate primary and secondary coil positioning processes caused the following problem: it was difficult to maintain a certain coil pressure as well as evenly maintain the positioning accuracy of coils. Thus, the range of both the degree of detection errors and the level of reception became uncertain. Therefore, it has not been possible to make a thin and small sensor in terms of the structure. The prior art was easily affected by surrounding factors such as broken wires.

SUMMARY OF THE INVENTION

The present invention is directed to a weak-field magnetic sensor that solves the previously described problem of the prior technology. Coil positioning technology is not required. The positioning accuracy can be controlled in increments of microns. There is virtually no unevenness concerning the range of detection errors and the level of reception. It is possible to make a thin and small sensor in terms of the structure disclosed. Moreover, it is not easily affected by outside factors such as broken wires. It is also capable of being mass produced.

The present invention utilizes materials such as alloys that are not affected by stress and which allow fewer changes to magnetic characteristics. It also creates the same advantageous conditions as a wire coil environment by utilizing etching technology. The aforesaid invention is a weak-field magnetic sensor which is characterized by the following features: a certain pattern is etched on an epoxy base thin board with the capacity for vertical conductivity. Circular patterns are etched on the front and on the back surface of the amorphous thin boards. These amorphous thin boards are stacked on both sides of the above mentioned epoxy base to form an amorphous core. The sensor can also have two other epoxy bases and one other amorphous epoxy base. A coil Y is etched on one epoxy base while a coil X is etched on the other epoxy base. Circular patterns are etched on the amorphous epoxy base. These two epoxy bases and the amorphous epoxy base are stacked relative to one another on the top surface and on the bottom surface of the aforesaid amorphous core.

In the present invention, it is preferable that the epoxy base is made of materials that are capable of being etched such as glass epoxy, plastic, etc. It is also preferable to utilize etching process in which the conductor width can be controlled in increments of microns. The same effect can be achieved with the following magnetic sensor: the magnetic sensor utilizes a ring shape core made with the above mentioned amorphous thin board instead of the aforesaid flat board amorphous core. The ring shape core is created by cutting the above mentioned amorphous thin board into rings and etching so that it appears that it had been coiled with a toroidal core. The usage of the aforesaid invention will be explained in greater detail hereinafter referring to the charts.

BRIEF DESCRIPTION OF THE DRAWING FIGURES

With the foregoing and other objects, advantages, and features of the invention which will become hereinafter apparent, the nature of the invention may be more clearly understood by reference to the following detailed description of the invention, the appended claims, and to the several views illustrated in the attached drawings.

FIG. 4 is an explanatory chart of one assembly production process that illustrates an example of the amorphous magnetic sensor of the present invention, using a flat board core;

FIG. 6 is a disassembly chart indicating an example of the present invention using a ring core.

DETAILED DESCRIPTION OF THE PREFERRED EMBODIMENT

FIGS. 1 to 5 identify the method of assembly and the completed sensor. They indicate one illustrative embodiment of the amorphous magnetic sensor of the aforesaid invention. The amorphous magnetic sensor indicated in FIGS. 1–5 uses a flat board core. FIG. 6 is a disassembled view showing an alternative embodiment of the present invention with a ring core instead of the above indicated flat board core.

Figure 1:
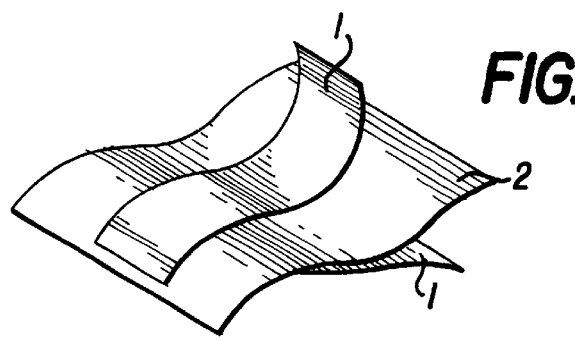
FIG. 1 is an explanatory chart of one assembly production process that illustrates an example of the amorphous magnetic sensor of the present invention, using a flat board core.
Figure 2:
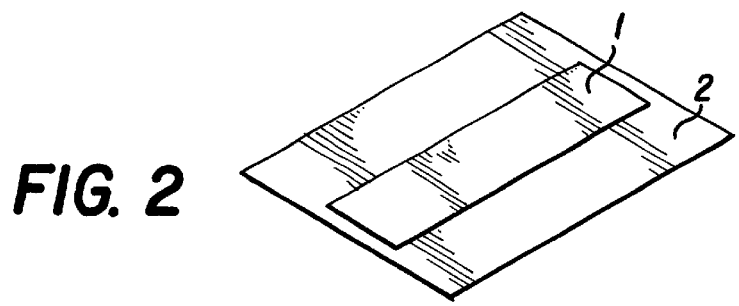
FIG. 2 is an explanatory chart of one assembly production process that illustrates an example of the amorphous magnetic sensor of the present invention, using a flat board core.
Figure 3:
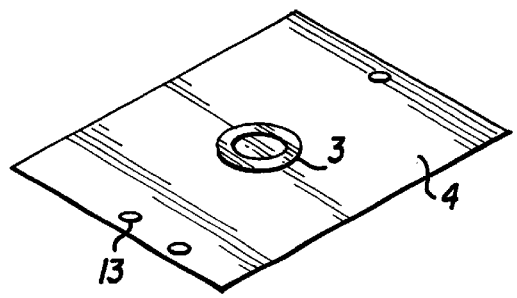
FIG. 3 is an explanatory chart of one assembly production process that illustrates an example of the amorphous magnetic sensor of the present invention, using a flat board core.
Figure 5:
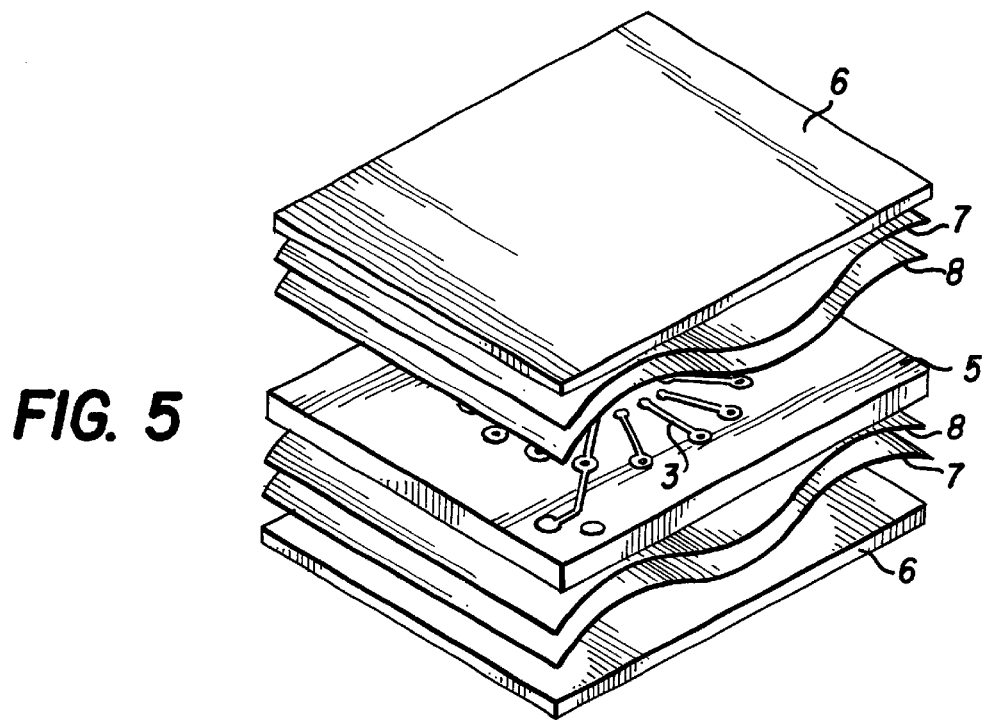
FIG. 5 is an explanatory chart of the last assembly production process that illustrates an example of the amorphous magnetic sensor of the present invention, using a flat board core.

In each drawing figure, Reference numeral 1 indicates an amorphous thin board. Reference numeral 2 indicates a thin board glass epoxy base having specific conductive patterns etched with the capacity for vertical conductivity. The amorphous thin board 1 is stacked and fixed on both surfaces of the aforesaid epoxy base 2 in advance (see FIG. 1). Next, a stacked board is formed by applying a pressing process as indicated in FIG. 2. Specific circular patterns 3 are etched in advance on another amorphous thin board 2. Another amorphous stacked board 4, as indicated in FIG. 3, is established on the aforesaid epoxy base 2 and corresponds to its conductive patterns. Further, a porous process 13 can be applied to the amorphous stacked board 4 if necessary.

Then, the amorphous stacked board 4 is set as a core as indicated in FIG. 4. There are two glass epoxy bases 2a and 2b. They have specific conductive patterns etched in advance. These glass epoxy bases are stacked and pressed both on the top surface and on the bottom surface corresponding to the etched conductive patterns. Thus, a flat board core 5 is formed.

Next, two pieces of the following three components are made alongside the flat board amorphous core 5. A conductive pattern 10 for coil X is etched on the glass epoxy base 6 to form coil X as is indicated in FIG. 6. A conductive pattern 11 for coil Y is etched on the glass epoxy base 7 to form the coil Y. A circular conductive pattern 12 is etched on the amorphous glass epoxy base to form the amorphous coil 12 on base 8. The coil X on base 6, the coil Y on base 7, and the amorphous coil 12 on base 8 are stacked and pressed on both the top surface and on the bottom surface of the flat board core 5 on the outer sides. Each coil is stacked on the core in the order of coil X on base 6, coil Y on base 7, and then amorphous coil 12 on base 8. Also, each coil X, Y, and 12 is aligned according to the etched conductor patterns of each coil so they are conductive. Thus, a weak-field magnetic sensor is obtained (see FIG. 5).

The etching width of each conductor pattern is on the order of a few microns. It is possible to make an extremely small magnetic sensor with such dimensions. Even though a glass epoxy base was used for epoxy bases 2, 6, 7, and 8 in this illustrative example, the present invention contemplates the use of other materials capable of bearing etched conductor patterns, such as plastic.

FIGS. 1 to 5 explain the illustrative example utilizing the case of a flat board amorphous core 5. However, an alternative illustrative embodiment is shown in FIG. 6. It is possible to make the following magnetic sensor within the scope of the present invention as follows: the magnetic sensor utilizes a ring shape core that was first made from the aforesaid amorphous thin board. The ring shape core 9 is created by cutting the amorphous thin board into rings and then etching the board so that it appears that it has been coiled with a toroidal core.

As described above, the aforesaid invention includes the following effects:

the magnetic sensor does not require precise coil positioning technology as does the known technology. Thus, the range of detection errors and the level of reception has no disturbances. Also, the positioning and dimensional accuracy can be controlled in increments of microns or less. Moreover, a thin material can be used due to use of the etching process. It is possible to imbed the electronic circuit on the same material as a driver. Thus, a very thin and small sensor can be realized. Furthermore, it is not easily affected by outside factors such as broken wires. It is also capable of being mass produced.

Although certain presently preferred embodiments of the invention have been described herein, it will be apparent to those skilled in the art to which the invention pertains that variations and modifications of the described embodiment may be made without departing from the spirit and scope of the invention. Accordingly, it is intended that the invention be limited only to the extent required by the appended claims and the applicable rules of law.

What is claimed is:

1. A method of making a weak-field magnetic sensor, comprising the steps of:

etching on an epoxy base thin board a certain conductor pattern with the capacity for vertical conductivity;

etching circular conductor patterns on the front and back surfaces of at least two amorphous thin boards;

stacking the epoxy base thin board and the amorphous thin boards so that the epoxy base thin board is located between the amorphous thin boards and pressing the stacked epoxy base thin board and amorphous thin boards together to correspond to the pattern of the epoxy base thin board and the patterns of the amorphous thin boards to form a flat-board shaped amorphous core;

etching a first coil on a first epoxy base, a second coil on a second epoxy base, and a circular conductive pattern on an amorphous epoxy base;

stacking two board sets, each of which includes the first epoxy base, the second epoxy base and the amorphous epoxy base, and the amorphous core so that the amorphous core is located between the board sets; and pressing together the stacked board sets and the amorphous core.

2. A method of making a weak-field magnetic sensor comprising the steps of:

making a ring-shaped amorphous core;

etching a certain coil pattern on the ring-shaped amorphous core;

etching a first coil on a first epoxy base, a second coil on a second epoxy base, and a circular conductive pattern on an amorphous epoxy base;

stacking two board sets, each of which includes the first epoxy base, the second epoxy base and the amorphous epoxy base, and the ring-shaped amorphous core so that the ring-shaped amorphous core is located between the board sets; and pressing together the stacked board sets and the ring-shaped core.

3. The method of claim 1, wherein the first and second epoxy base is a glass epoxy material.

4. The method of claim 1, wherein the first and second epoxy base is a plastic.

5. The method of claim 2, wherein the first and second epoxy base is a glass epoxy material.

6. The method of claim 2, wherein the first and second epoxy base is plastic.

7. A method of making a weak-field magnetic sensor, comprising the steps of:

etching on an epoxy base thin board a certain conductor pattern with the capacity for vertical conductivity;

etching circular conductor patterns on front and back surfaces of at least two amorphous thin boards;

stacking the epoxy base thin board and the amorphous thin boards so that the epoxy base thin board is located between the amorphous thin boards and pressing the stacked epoxy base thin board and amorphous thin boards together to correspond to the pattern of the epoxy base thin board and the patterns of the amorphous thin boards to form a flat-board shaped amorphous core;

etching a first coil on a first epoxy base, a second coil on a second epoxy base, and a circular conductive pattern on an amorphous epoxy base;

stacking the first epoxy base, the second epoxy base and the amorphous epoxy base on an outer portion of at least one surface of the amorphous core; and pressing together the stacked first epoxy base, second epoxy base, amorphous epoxy base and amorphous core.

8. A method of making a weak-field magnetic sensor, comprising the steps of:

making a ring-shaped amorphous core;

etching a certain coil pattern on the ring-shaped amorphous core;

etching a first coil on a first epoxy base, a second coil on a second epoxy base, and a circular conductive pattern on an amorphous epoxy base;

stacking the first epoxy base, the second epoxy base and the amorphous epoxy base on an outer portion of at least one surface of the ring-shaped core; and pressing together the stacked first epoxy base, second epoxy base, amorphous epoxy base and ring-shaped core.

* * * * *